(12) United States Patent
Shioda et al.

(10) Patent No.: US 8,525,194 B2
(45) Date of Patent: Sep. 3, 2013

(54) NITRIDE SEMICONDUCTOR DEVICE, NITRIDE SEMICONDUCTOR WAFER AND METHOD FOR MANUFACTURING NITRIDE SEMICONDUCTOR LAYER

(75) Inventors: Tomonari Shioda, Kanagawa-ken (JP); Hung Hung, Kanagawa-ken (JP); Jongil Hwang, Kanagawa-ken (JP); Taisuke Sato, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 13/222,561

(22) Filed: Aug. 31, 2011

(65) Prior Publication Data

US 2012/0292632 A1    Nov. 22, 2012

(30) Foreign Application Priority Data

May 16, 2011   (JP) .................... 2011-109070

(51) Int. Cl.
*H01L 29/201* (2006.01)
*H01L 33/00* (2010.01)

(52) U.S. Cl.
USPC .. 257/90; 438/47; 257/E33.034; 257/E33.012

(58) Field of Classification Search
USPC ............... 257/79–103, E33.012, E33.001, 257/E33.008–E33.009, E33.023, E33.025, 257/E33.028, E33.03, E33.031–E33.034; 438/29–47
See application file for complete search history.

(56) References Cited

U.S. PATENT DOCUMENTS 7,612,363 B2 * 11/2009 Takeda et al. .............. 257/14

FOREIGN PATENT DOCUMENTS

| JP | 2003-142729 | 5/2003 |
|---|---|---|
| JP | 2006-186005 | 7/2006 |
| JP | 2007-288002 | 11/2007 |
| JP | 4168284 B2 | 10/2008 |
| JP | 2010-251390 | 11/2010 |
| JP | 2011-61063 | 3/2011 |
| KR | 10-2007-0043035 | 4/2007 |

OTHER PUBLICATIONS

Machine translations of JP 2006-186005 and JP 2010-251390.*
Office Action issued Nov. 17, 2011 in Japanese Patent Application No. 2011-109070 (with English translation).
U.S. Appl. No. 13/407,169, filed Feb. 28, 2012, Shioda, et al.
U.S. Appl. No. 13/602,868, filed Sep. 4, 2012, Hikosaka, et al.
U.S. Appl. No. 13/604,183, filed Sep. 5, 2012, Hikosaka, et al.
Office Action issued Jan. 29, 2013, in Korean Patent Application No. 10-2012-0020285 with English translation.

* cited by examiner

*Primary Examiner* — Julio J Maldonado
*Assistant Examiner* — Sonya D McCall Shepard
(74) *Attorney, Agent, or Firm* — Oblon, Spivak, McClelland, Maier & Neustadt, L.L.P.

(57) ABSTRACT

According to one embodiment, a nitride semiconductor device includes a foundation layer and a functional layer. The foundation layer is formed on an Al-containing nitride semiconductor layer formed on a silicon substrate. The foundation layer has a thickness not less than 1 micrometer and including GaN. The functional layer is provided on the foundation layer. The functional layer includes a first semiconductor layer. The first semiconductor layer has an impurity concentration higher than an impurity concentration in the foundation layer and includes GaN of a first conductivity type.

18 Claims, 5 Drawing Sheets

NITRIDE SEMICONDUCTOR DEVICE, NITRIDE SEMICONDUCTOR WAFER AND METHOD FOR MANUFACTURING NITRIDE SEMICONDUCTOR LAYER

CROSS-REFERENCE TO RELATED APPLICATIONS

This application is based upon and claims the benefit of priority from the prior Japanese Patent Application No. 2011-109070, filed on May 16, 2011; the entire contents of which are incorporated herein by reference.

FIELD

Embodiments described herein relate generally to a nitride semiconductor device, a nitride semiconductor wafer, and a method for manufacturing a nitride semiconductor layer.

BACKGROUND

Light emitting diodes (LEDs) which are semiconductor light emitting devices using a nitride semiconductor are used for display devices and illumination lamps, for example. Electron devices using a nitride semiconductor are also utilized for high-frequency electron devices and high-power devices.

When such nitride semiconductor device is formed on a silicon (Si) substrate excellent in mass productivity, defects and cracks tend to be generated caused by the difference in lattice constants or thermal expansion coefficients. Technologies for manufacturing a crystal having high quality on a silicon substrate are desired.

DETAILED DESCRIPTION

Figure 1:
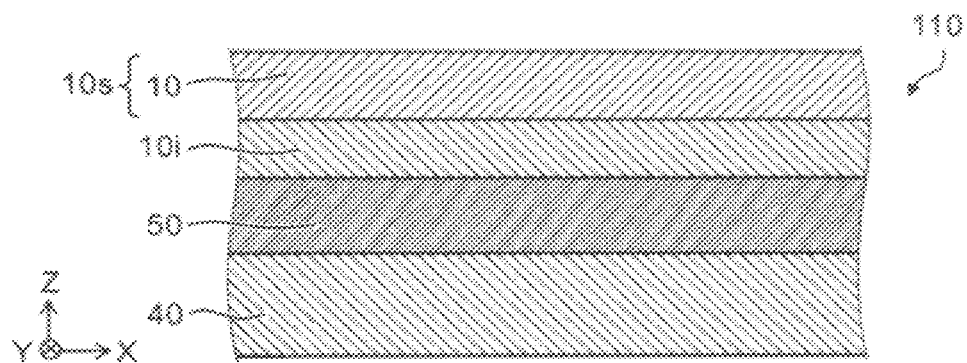
FIG. 1 is a schematic cross-sectional view showing a nitride semiconductor device according to a first embodiment.

In general, according to one embodiment, a nitride semiconductor device includes a foundation layer and a functional layer. The foundation layer is formed on an Al-containing nitride semiconductor layer formed on a silicon substrate. The foundation layer has a thickness not less than 1 micrometer and including GaN. The functional layer is provided on the foundation layer. The functional layer includes a first semiconductor layer. The first semiconductor layer has an impurity concentration higher than an impurity concentration in the foundation layer and includes GaN of a first conductivity type.

According to another embodiment, a nitride semiconductor wafer includes a silicon substrate, an Al-containing nitride semiconductor layer, a foundation layer, and a functional layer. The Al-containing nitride semiconductor layer is provided on the silicon substrate. The foundation layer is provided on the Al-containing nitride semiconductor layer. The foundation layer has a thickness not less than 1 micrometer, and includes GaN. The functional layer is provided on the foundation layer. The functional layer includes a first semiconductor layer. The first semiconductor layer has an impurity concentration higher than an impurity concentration in the foundation layer and includes GaN of a first conductivity type.

According to another embodiment, a method for manufacturing a nitride semiconductor layer is disclosed. The method can form an Al-containing nitride semiconductor layer on a silicon substrate. The method can form, on the Al-containing nitride semiconductor layer, a foundation layer having a thickness not less than 1 micrometer and including GaN. In addition, the method can form, on the foundation layer, a functional layer including a first semiconductor layer. The first semiconductor layer has an impurity concentration higher than an impurity concentration in the foundation layer and includes GaN of a first conductivity type.

Hereinafter, embodiments of the invention will be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described previously in regard to the earlier drawings are marked with like reference numerals, and a detailed description is omitted as appropriate.

(First Embodiment)

The embodiment relates to a nitride semiconductor device. The nitride semiconductor devices according to the embodiment include semiconductor devices such as semiconductor light emitting devices, semiconductor light receiving devices and electron devices. The semiconductor light emitting devices include, for example, a light emitting diode (LED), a laser diode (LD), etc. The semiconductor light receiving devices include a photo diode (PD), etc. The electron devices include, for example, a high electron mobility transistor (HEMT), a heterojunction bipolar transistor (HBT), a field-effect transistor (FET), a Schottky barrier diode (SBD), etc.

FIG. 1 is a schematic cross-sectional view illustrating the configuration of the nitride semiconductor device according to the first embodiment.

As shown in FIG. 1, a nitride semiconductor device 110 according to the embodiment includes a foundation layer 10i, and a functional layer 10s.

The foundation layer 10i is formed on an Al-containing nitride semiconductor layer 50. The Al-containing nitride semiconductor layer 50 has been formed on a silicon substrate 40. The silicon substrate 40 is, for example, a Si (111) substrate. But, in the embodiment, the plane orientation of the silicon substrate 40 may not be the (111) plane.

The foundation layer 10i has a low impurity concentration. The foundation layer 10i includes GaN. The foundation layer 10i is, for example, an undoped GaN layer. For example, the impurity concentration in the foundation layer 10i is not more than $1×10^{17}$ cm$^{-3}$. For example, the impurity concentration in the foundation layer 10i is not more than the detection limit.

The foundation layer 10i has a thickness not less than 1 micrometer (μm).

The functional layer 10s is provided on the foundation layer 10i. The functional layer 10s includes a first semiconductor layer 10. The first semiconductor layer 10 has a higher impurity concentration than the impurity concentration in the foundation layer 10i. The first semiconductor layer 10 includes GaN of a first conductivity type. For example, the first semiconductor layer 10 contains Si with a concentration of than $5×10^{18}$ cm$^{-3}$.

For example, the first conductivity type is an n-type, and a second conductivity type is a p-type. Alternatively, the first conductivity type may be a p-type and the second conductivity type may be an n-type. Hereinafter, a case where the first conductivity type is an n-type and the second conductivity type is a p-type is described.

For example, the first semiconductor layer 10 is an n-type GaN layer.

Here, a direction from the foundation layer 10i toward the functional layer 10s is defined as a Z axis direction. An axis perpendicular to the Z axis is defined as an X axis. An axis perpendicular to the Z axis and the X axis is defined as a Y axis.

Hereinafter, a case where the nitride semiconductor device 110 is a light emitting device is described.

Figure 2:
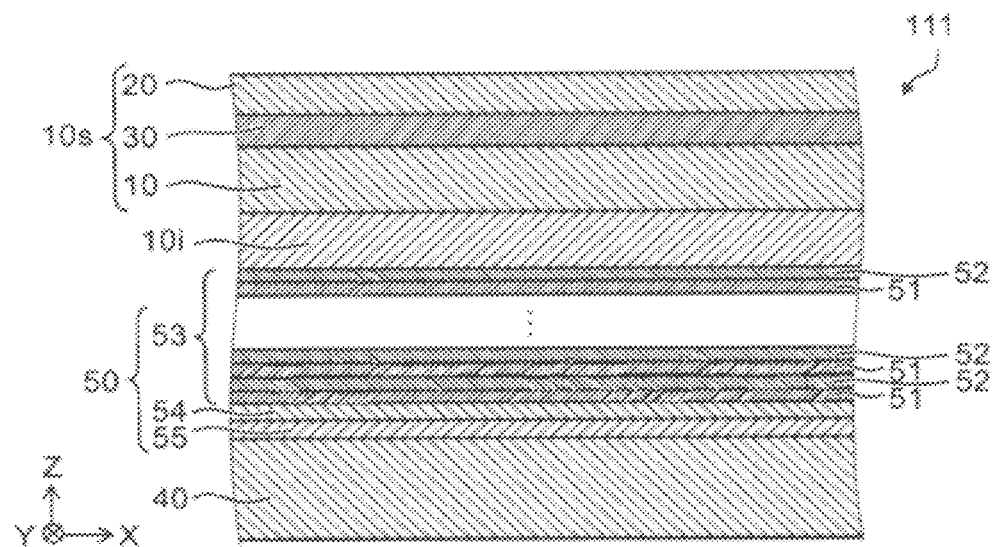
FIG. 2 is a schematic cross-sectional view showing the nitride semiconductor device according to the first embodiment.

FIG. 2 is a schematic cross-sectional view illustrating the configuration of the nitride semiconductor device according to the first embodiment.

As shown in FIG. 2, in a nitride semiconductor device 111 that is an example according to the embodiment, the functional layer 10s further includes a light emitting part 30 and a second semiconductor layer 20.

The light emitting part 30 is provided on the first semiconductor layer 10. The second semiconductor layer 20 is provided on the light emitting part 30. The second semiconductor layer 20 includes a nitride semiconductor, and is of a second conductivity type. The second conductivity type is different from the first conductivity type.

By flowing an electric current to the light emitting part via the first semiconductor layer 10 and the second semiconductor layer 20, light is emitted from the light emitting part 30. A specific example of the light emitting part 30 is to be described later.

As shown in FIG. 2, in the example, the Al-containing nitride semiconductor layer 50 includes a buffer layer 55, an intermediate layer 54, and a multilayer structure body 53. The buffer layer 55 is provided on the silicon substrate 40, and includes AlN. The buffer layer 55 has a thickness of, for example, about 30 nanometers (nm). As described above, by using AlN, which hardly reacts chemically with the silicon substrate, as the buffer layer 55 contacting with Si, problems such as meltback etching may be solved easily.

The intermediate layer 54 is provided on the buffer layer 55, and includes AlGaN. As the intermediate layer 54, for example, $Al_{0.25}Ga_{0.75}N$ layer is used. The intermediate layer 54 has a thickness of, for example, about 40 nm. The intermediate layer 54 may be omitted.

The multilayer structure body 53 is provided on the intermediate layer 54. The multilayer structure body 53 includes a plurality of first layers 51 and a plurality of second layers 52, each of the second layers 52 are stacked with the first layers alternately.

As the first layer 51, for example, a GaN layer having a thickness of 30 nm is used. As the second layer 52, for example, an AlN layer having a thickness of 8 nm is used. In this case, each number of the first layers 51 and the second layers 52 (that is, the number of pairs) is, for example, 60.

As the first layer 51, for example, a GaN layer having a thickness of 300 nm is used. As the second layer 52, for example, an AlN layer having a thickness of 12 nm is used. In this case, each number of the first layers 51 and the second layers 52 (that is, the number of pairs) is, for example, 3.

The second layer 52 (AlN layer) is, for example, grown at low temperatures. Hereinafter, the second layer 52 (AlN layer) is called a low temperature grown layer. But, in the multilayer structure body 53, in particular, in a case where the first layer 51 and the second layer 52 are repeated at a short period (for example, the first layer 51 is 30 nm, and the second layer is 8 nm, etc.), the second layer 52 is not necessarily grown at low temperatures. Hereinafter, a case of a long period (for example, the first layer 51 is 300 nm, and the second layer 52 is 12 nm, etc.) is described.

Figure 3:
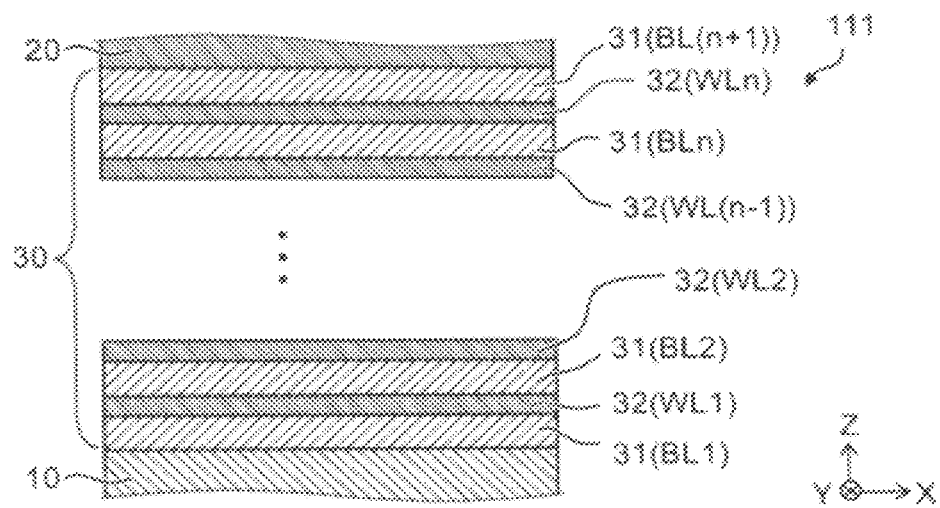
FIG. 3 is a schematic cross-sectional view showing a part of the nitride semiconductor device according to the first embodiment.

FIG. 3 is a schematic cross-sectional view illustrating the configuration of a part of the nitride semiconductor device according to the first embodiment.

As shown in FIG. 3, the light emitting part 30 includes a plurality of barrier layers 31 and a well layer 32 provided between the barrier layers 31. For example, the plurality of barrier layers 31 and a plurality of the well layers 32 are stacked along the Z axis.

In the specification of the application, "stacked" includes a case where layers are overlapped with another layer inserted between them, in addition to a case where the layers are overlapped while contacting with each other. And, "a layer provided on something" includes a case where the layer is provided with another layer inserted between them, in addition to a case where the layer is provided while contacting directly.

The well layer 32 includes, for example, $In_{x1}Ga_{1-x1}N$ (0<X1<1). The barrier layer 31 includes, for example, GaN. That is, for example, well layer 32 includes In, and the barrier layer 31 substantially does not include In. The bandgap energy in the barrier layer 31 is larger than the bandgap energy in the well layer 32.

The light emitting part 30 may have a single quantum well (SQW) structure. In this case, the light emitting part 30 includes two barrier layers 31 and the well layer 32 provided between the barrier layers 31. Alternatively, the light emitting part 30 may have a multi quantum well (MQW) structure. In this case, the light emitting part 30 has a number of barrier layers 31 not less than 3 and each of well layers 32 is provided between each of the barrier layers 31.

That is, the light emitting part 30 includes (n+1) barrier layers 31, and n well layers 32 ("n" is an integer not less than 2). The (i+1)th barrier layer BL(i+1) is arranged between the ith barrier layer BLi and the second semiconductor layer 20 ("i" is an integer not less than 1 and not more than (n−1)). The (i+1)th well layer WL(i+1) is arranged between the ith well layer WLi and the second semiconductor layer 20. The first barrier layer BL1 is provided between the first semiconductor layer 10 and the first well layer WL1. The nth well layer WLn is provided between the nth barrier layer BLn and the (n+1)th barrier layer BL(n+1). The (n+1)th barrier layer BL(n+1) is provided between the nth well layer WLn and the second semiconductor layer 20.

The light (emitted light) emitted from the light emitting part 30 has a peak wavelength not less than 200 nm and not more than 1600 nm. But, in the embodiment, the peak wavelength is arbitrary.

In the embodiment, as described above, the multilayer structure body 53 is provided. The multilayer structure body 53 includes a low temperature grown AlN layer (second layer 52). The second layer 52 is provided periodically. This can, for example, reduce the dislocation and suppress cracks. The lattice of the AlN layer does not match the lattice of the GaN layer lying directly below, and the strain is relaxed to tend to have the lattice constant of AlN that is not influenced from the strain In the multilayer structure body 53, by forming the GaN layer so as to grow pseudomorphically on the low temperature grown AlN layer 52, GaN grows with compressive strain to generate warpage being convex upward. By forming repeatedly these AlN and GaN, the warpage being convex further upward may be generated largely. The introduction of the warpage being convex upward previously into layers in crystal growth can cancel tensile strain given in temperature fall after the crystal growth caused by the difference in thermal expansion coefficients between Si and GaN to tend to suppress the generation of cracks.

The providing the multilayer structure body 53 not only suppresses the generation of cracks, but also can terminate defects such as threading dislocations caused by lattice mismatch between the silicon substrate 40 and the nitride semiconductor layer (functional layer 10s). This can suppress the propagation of the defects to the foundation layer 10i (for example, i-GaN layer), the first semiconductor layer 10 (n-GaN layer), and a nitride semiconductor layer formed thereon (such as the light emitting part 30, the second semiconductor layer 20, etc.). This enables to obtain high performance nitride semiconductor devices.

The thickness of the second layer 52 (low temperature AlN layer) is, for example, not less than 5 nm and not more than 20 nm. The crystal growth temperature of the second layer 52 is, for example, not less than 600° C. and not more than 1050° C. By setting the thickness and the temperature in such regions, the lattice tends to relax in the low temperature AlN layer. Consequently, in forming the low temperature AlN, it is hardly affected by the tensile strain from the GaN layer (first layer 51) serving as a foundation. As the result, it is possible to form effectively the lattice constant of AlN that is not affected by the strain from the GaN layer (first layer 51) serving as the foundation.

When the thickness of the second layer 52 is smaller than 5 nm, the lattice of AlN does not sufficiently relax. When the thickness of the second layer 52 is larger than 20 nm, dislocations caused by lattice relaxation increase.

When the crystal growth temperature of the second layer 52 is lower than 600° C., impurities may be taken in easily. Moreover, cubic AlN is grown to generate too much crystal dislocations. When the crystal growth temperature of the second layer 52 is higher than 1050° C., the strain is not relaxed and tensile strain tends to be introduced into the second layer 52. Furthermore, compressive strain cannot suitably be applied to the first layer 51 grown on the second layer 52 and to a GaN layer (such as the foundation layer 10i and the first semiconductor layer 10) on the layer 51, and cracks tend to be generated in temperature falling after the crystal growth.

In the multilayer structure body 53, by setting the number of the second layer 52 (low temperature AlN layer) to be not less than 2, the effect of suppressing the generation of cracks is enhanced.

The interval between each of the second layers 52 (low temperature AlN layer) is desirably not less than 15 nm and not more than 1000 nm. When forming a GaN layer (first layer 51) on the low temperature AlN layer, as described later, the GaN layer (first layer 51) of from 100 nm to 200 nm is apt to grow while quasi-lattice-matching with the low temperature AlN layer and be applied with compressive strain. Accordingly, when the interval between each of the low temperature AlN layers is larger than 1000 nm, the effect of making the compressive strain is insufficient. When the interval is less than 15 nm, the number of low temperature AlN layers in the multilayer structure body 53 becomes too large, and processes of temperature falling and temperature rising are repeated excessively to deteriorate the usage efficiency of raw materials of the crystal growth device.

Hereinabove, the structure, in which the Al-containing nitride semiconductor layer 50 has the multilayer structure body 53 and the multilayer structure body 53 includes the low temperature AlN layer, is described, but the embodiment is not limited to this. As the Al-containing nitride semiconductor layer 50, a layer having a function to introduce previously the compressive strain into at least either of the foundation layer 10i and the functional layer 10s is used. This can give an effect of the same kind as that described above.

For example, as described above, the Al-containing nitride semiconductor layer 50 may include, for example, a superlattice structure of AlN and GaN. Or, as the Al-containing nitride semiconductor layer 50, a plurality of $Al_xGa_{1-x}N$ ($0 \leq x \leq 1$) layers having an inclined composition may be used.

As described already, the thickness of the foundation layer 10i (i-GaN layer) is not less than 1 μm. The thickness of the foundation layer 10i is smaller than that of the first semiconductor layer 10 (n-GaN layer). As described later, by setting the thickness of the foundation layer 10i to be not less than 1 μm, the effect of reducing dislocation density is enhanced. That is, the dislocation density in the upper face of the foundation layer 10i (surface on the side of the first semiconductor layer 10) is smaller than the dislocation density in the lower face of the foundation layer 10i (surface on the side of the Al-containing nitride semiconductor layer 50).

When the thickness of the foundation layer 10i is not less than that of the first semiconductor layer 10, the total thickness (summed thickness of the foundation layer 10i and the functional layer 10s including the first semiconductor layer 10) becomes too large, and many cracks may be generated.

The thickness of the first semiconductor layer 10 is desirably not less than 1 μm and not more than 4 μm. In a case where the first semiconductor layer 10 works as an n-type contact layer of LED, when the thickness of the first semiconductor layer 10 is less than 1 μm, the spread of the current tends to be insufficient and to result in nonuniform emission. In addition, the resistance tends to be high. When the thickness of the first semiconductor layer 10 exceeds 4 μm, cracks may be generated easily in temperature falling after the crystal growth.

As described above, in the nitride semiconductor devices 110 and 111 according to the embodiment, on the silicon substrate 40, the Al-containing nitride semiconductor layer 50 is formed, the foundation layer 10i of i-GaN of a low impurity concentration (for example, undoped) is provided thereon, and the first semiconductor layer 10 of n-GaN is provided thereon. This suppresses the dislocation in the first semiconductor layer 10 and reduces cracks etc. As described above, according to the embodiment, nitride semiconductor devices excellent in crystal quality with a low dislocation density can be obtained.

The configuration was found by an experiment below. Hereinafter, the experiment that was performed independently by the inventors is described.

In the experiment, a metal-organic vapor phase epitaxy (MOVPE) was used for growing a crystal of the semiconductor layer.

First, the silicon substrate 40 of Si (111) was cleaned with a 1:1 mixed liquid of $H_2O_2$ and $H_2SO_4$ for 13 min. Next, the silicon substrate 40 was cleaned using 2% HF for 10 min. After the cleaning, the silicon substrate 40 was introduced into an MOVPE reactor.

The temperature of a susceptor was raised to 1000° C. under hydrogen ambient and TMA was supplied for 8 sec. After that, by further supplying $NH_3$, an AlN layer of 30 nm was formed as the buffer layer 55.

Subsequently, the temperature of the susceptor was raised to 1030° C. and an $Al_{0.25}Ga_{0.75}N$ layer of 40 nm was formed as the intermediate layer 54.

Next, the temperature of the susceptor was raised to 1050° C., an AlN layer (second layer 52) of 8 nm and a GaN layer (first layer 51) of 30 nm were repeated alternately to form the multilayer structure body 53 (supperlattice structure).

Next, the temperature of the susceptor was raised to 1080° C. and an undoped GaN layer of 1 μm was formed as the foundation layer 10i.

Subsequently, by further supplying $SiH_4$, an n-type doped GaN layer of 1 μm was formed as the first semiconductor layer 10.

Next, subsequently, the light emitting part 30 (multi quantum well structure) to be an active layer of LED was formed. Furthermore, a p-type GaN layer was formed as the second semiconductor layer 20. This forms an LED structure.

After the end of the crystal growth, the wafer sample (including the silicon substrate 40 and semiconductor layers formed thereon) was taken out of the reactor. This forms the nitride semiconductor device 111 according to the embodiment.

In contrast, a nitride semiconductor device of a first reference example was manufactured.

Figure 4:
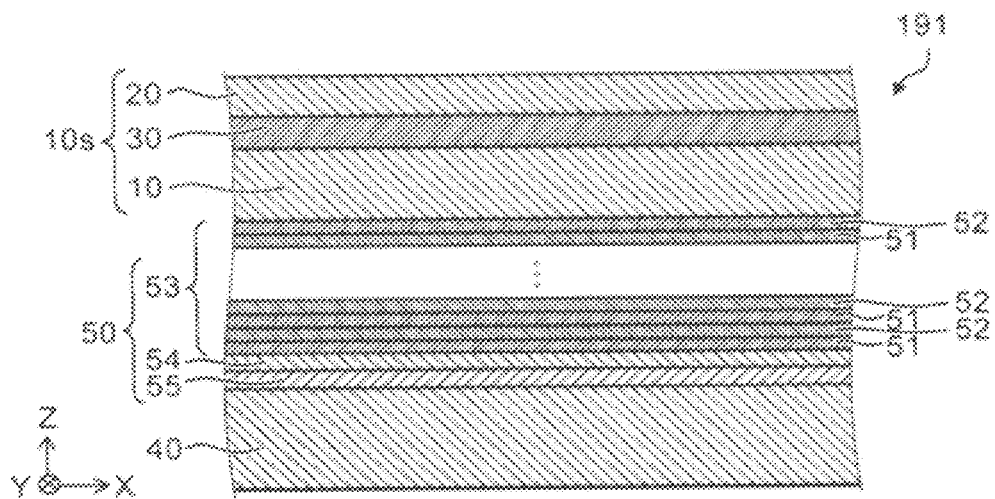
FIG. 4 is a schematic cross-sectional view showing a nitride semiconductor device of a first reference example.

FIG. 4 is a schematic cross-sectional view illustrating the configuration of the nitride semiconductor device of the first reference example.

As shown in FIG. 4, in a nitride semiconductor device 191 of the first reference example, the foundation layer 10i is not provided. Except for the above, it is the same as the nitride semiconductor device 111, and, therefore, the description is omitted. In the nitride semiconductor device 191, the first semiconductor layer 10 (thickness 1.2 μm) was formed on the Al-containing nitride semiconductor layer 50 without forming the foundation layer 10i.

For the wafer sample of the nitride semiconductor device 111 according to the embodiment, and the wafer sample of the nitride semiconductor device 191 of the first reference example, a X-ray rocking curve (XRC) measurement was performed.

As the result, in the nitride semiconductor device 111 according to the embodiment, a full width at half maximum of XRC (002) plane was 715 seconds, and a full width at half maximum of XRC (101) plane was 1283 seconds.

In contrast, in the nitride semiconductor device 191 of the first reference example, a full width at half maximum of XRC (002) plane was 1278 seconds, and a XRC full width at half maximum of (101) plane was 2030 seconds.

The full width at half maximum of XRC corresponds to the defect density. As described above, the first reference example has a high defect density. That is, in the nitride semiconductor device 191 of the first reference example, properties are insufficient.

In contrast, in the nitride semiconductor device 111 according to the embodiment, the XRC full width at half maximum is small. That is, the nitride semiconductor device 111 can give high properties.

Figure 5A:
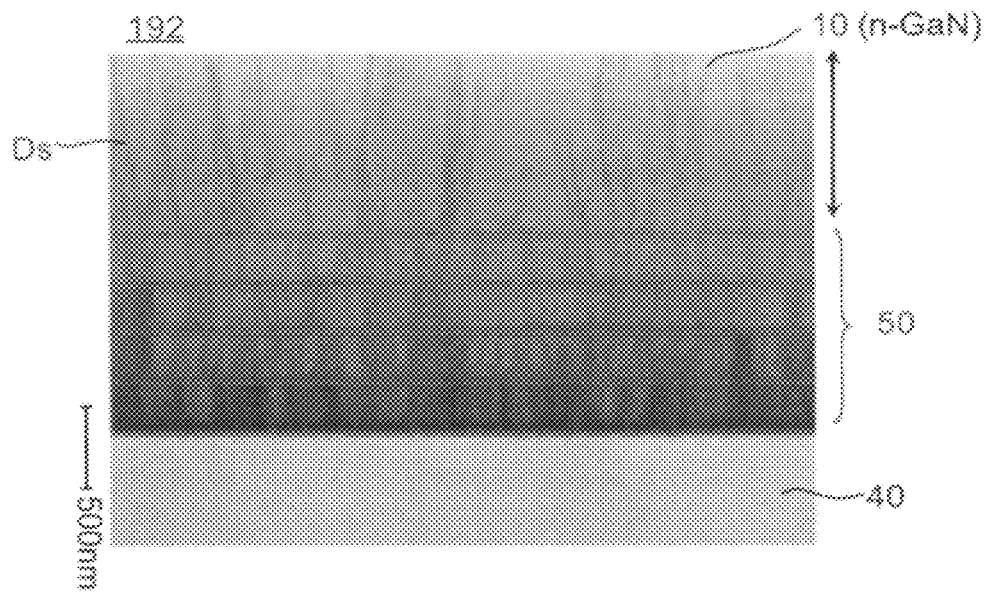
FIGS. 5A and 5B are cross-sectional SEM images showing properties of wafer samples of a second and a third reference examples.
Figure 5B:
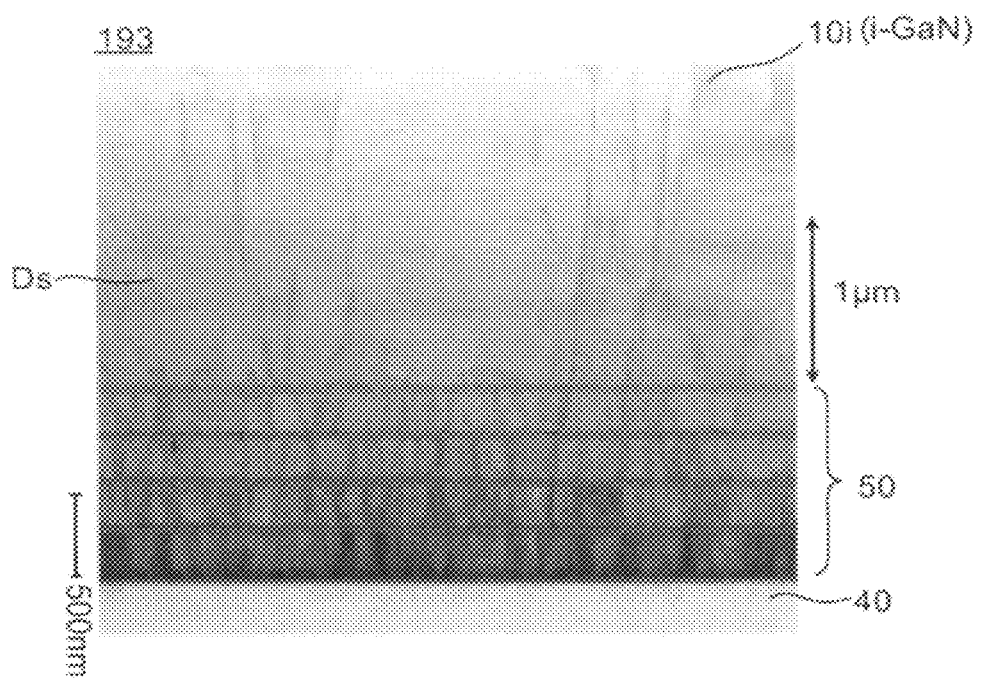

FIGS. 5A and 5B are cross-sectional SEM images illustrating properties of wafer samples of a second and a third reference examples.

In a wafer sample 192 of the second reference example illustrated in FIG. 5A, an n-type GaN layer having a thickness of 1.2 μm (corresponding to the first semiconductor layer 10) was formed on the Al-containing nitride semiconductor layer 50. In a wafer sample 193 of the third reference example illustrated in FIG. 5B, an undoped GaN layer having a thickness of 2.1 μm (corresponding to a case where the foundation layer 10i has a large thickness) is formed on the Al-containing nitride semiconductor layer 50. In these samples, the multilayer structure body 53 of a four-layer periodic structure is provided as the Al-containing nitride semiconductor layer 50.

As shown in FIG. 5A, in the wafer sample 192 of the second reference example, dislocation Ds (for example, threading dislocation) extends along the stacking direction (Z axis direction) in the n-type GaN (n-GaN) layer on the Al-containing nitride semiconductor layer 50. And, when the n-type GaN layer is provided on the Al-containing nitride semiconductor layer 50, there are many dislocations Ds.

As shown in FIG. 5B, in the wafer sample 193 of the third reference example, the dislocation Ds bends from the stacking direction in the undoped GaN (i-GaN) layer lying up to a height of 1 μm from the Al-containing nitride semiconductor layer 50. Consequently, in the upper face of the i-GaN layer, the number of dislocations Ds decreases remarkably.

From this, by setting the thickness of the foundation layer 10i to be not less than 1 μm and providing the functional layer 10s thereon, the effect of reducing the dislocation Ds can be obtained effectively. By setting the thickness of the foundation layer 10i to be not less than 1 μm, it becomes possible to form nitride semiconductor devices having high crystal quality with reduced dislocations.

By setting the thickness of the foundation layer 10i to be not less than 1 μm, the effect of reducing the dislocation can be obtained sufficiently, and by setting the thickness of the foundation layer 10i to be not more than that of the first semiconductor layer 10, the generation of cracks can be suppressed effectively.

In the embodiment, by providing the foundation layer 10i (GaN layer of low impurity concentration) having a thickness not less than 1 μm between the Al-containing nitride semiconductor layer 50 and the first semiconductor layer 10 (functional layer 10s), the dislocation density is significantly reduced. When the thickness of a layer on the Al-containing nitride semiconductor layer 50 is large, cracks tend to be generated. Therefore, by setting the thickness of the foundation layer 10i, which does not directly contribute to the operation of the semiconductor device, to be a thickness that does not generate cracks or less and is not less than 1 μm, the generation of cracks is suppressed and the dislocation density is reduced to give good properties.

Meanwhile, an attempt is known, in which the suppression of crack generation is tried by forming a buffer layer including an AlN layer. However, in such a case, an n-type GaN layer having an LED function is formed continuously on such buffer layer and the behavior of the dislocation between the buffer layer and the functional layer is not known.

On the basis of the phenomenon found by the individual experiment of the inventors, the configuration of the embodiment has been built. This can provide nitride semiconductor device having a nitride semiconductor crystal of high quality formed on the silicon substrate 40.

(Second Embodiment)

The embodiment relates to a nitride semiconductor wafer. For the wafer, for example, there is provided at least a part of a semiconductor device, or a part serving as at least a part of a semiconductor device. The semiconductor device includes, for example, a semiconductor light emitting device, a semiconductor light receiving device, an electron device, etc.

Figure 6A:
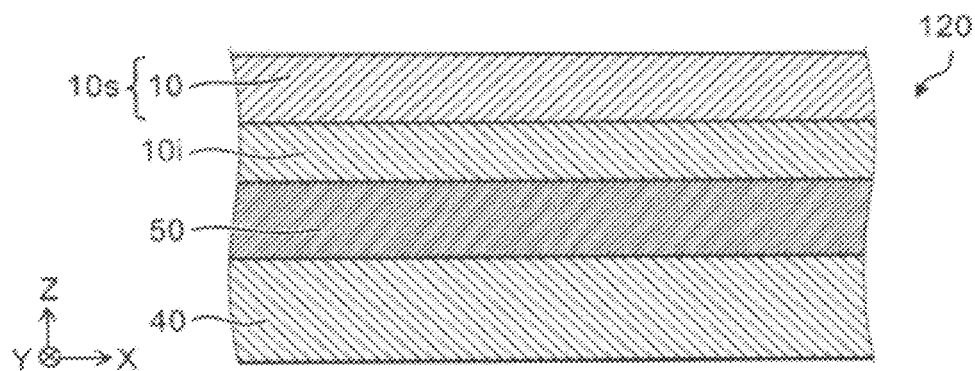
FIGS. 6A and 6B are schematic cross-sectional views showing nitride semiconductor wafers according to a second embodiment.
Figure 6B:
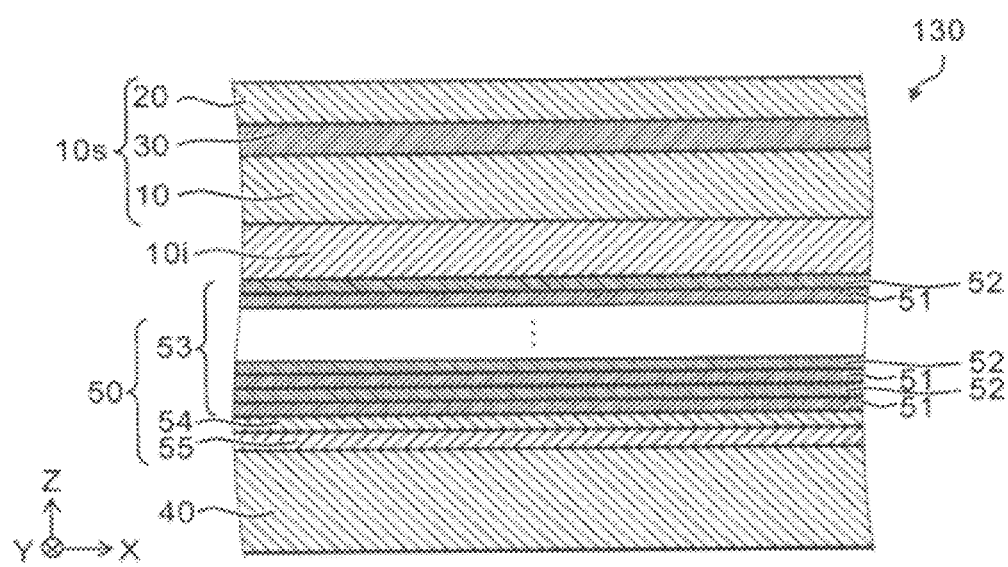

FIGS. 6A and 6B are schematic cross-sectional views illustrating the configuration of the nitride semiconductor wafer according to the second embodiment.

As shown in FIGS. 6A and 6B, nitride semiconductor wafers 120 and 130 according to the embodiment include the silicon substrate 40, the Al-containing nitride semiconductor layer 50, the foundation layer 10$i$, and the functional layer 10$s$. With regard to the silicon substrate 40, the Al-containing nitride semiconductor layer 50, the foundation layer 10$i$ and the functional layer 10$s$, the configuration described for the first embodiment can be applied.

As shown in FIG. 6B, the Al-containing nitride semiconductor layer 50 can include a buffer layer 55 provided on the silicon substrate 40 and including AlN, an intermediate layer 54 provided on the buffer layer 55 and including AlGaN, and a multilayer structure body 53 provided on the intermediate layer 54. The multilayer structure body 53 includes, for example, a plurality of first layers 51 including GaN and a plurality of second layers 52 including AlN stacked with the first layers 51 alternately.

This can provide a nitride semiconductor wafer for nitride semiconductor devices that is formed on a silicon substrate and has an excellent crystal quality with low dislocation density.

(Third Embodiment)

Figure 7:
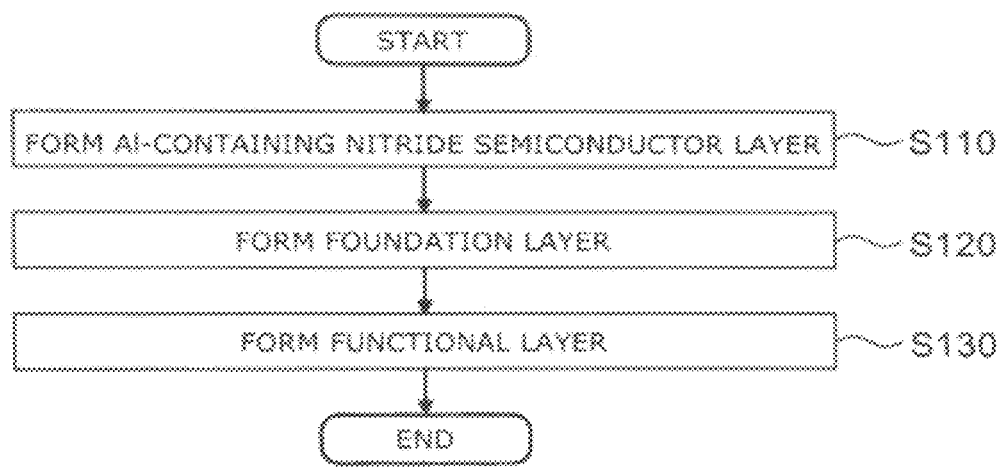
FIG. 7 is a flow chart showing a method for manufacturing nitride semiconductor layer according to a third embodiment.

FIG. 7 is a flow chart illustrating the method for manufacturing nitride semiconductor layer according to a third embodiment.

As shown in FIG. 7, in the manufacturing method, on the silicon substrate 40, the Al-containing nitride semiconductor layer 50 is formed (Step S110). On the Al-containing nitride semiconductor layer 50, the foundation layer 10$i$ having a thickness not less than 1 μm, and including GaN is formed (Step S120). For example, an impurity concentration in the foundation layer 10$i$ is low. On the foundation layer 10$i$, the functional layer 10$s$ including the first semiconductor layer 10 is formed (Step S130). The first semiconductor layer 10 has an impurity concentration higher than an impurity concentration in the foundation layer 10$i$ and includes GaN of the first conductivity type.

This can form a nitride semiconductor layer having an excellent crystal quality with low dislocation density, on a silicon substrate.

As described already, in the manufacturing method, the first semiconductor layer 10 desirably has a thickness not less than 1 μm. The foundation layer 10$i$ desirably has an impurity concentration not more than $1 \times 10^{17}$ cm$^{-3}$. The foundation layer 10$i$ desirably has a thinner thickness than the thickness of the first semiconductor layer 10.

In the embodiment, for growing the semiconductor layer, for example, such methods may be used as metal-organic chemical vapor deposition (MOCVD), metal-organic vapor phase epitaxy (MOVPE), molecular beam epitaxy (MBE), halide vapor phase epitaxy (HVPE), etc.

For example, when the MOCVD or the MOVPE is used, as raw materials in forming respective semiconductor layers, followings may be used. As the raw material of Ga, for example, TMGa (trimethyl gallium) and TEGa (triethyl gallium) may be used. As the raw material of In, for example, TMIn (trimethyl indium), TEIn (triethyl indium), etc. may be used. As the raw material of Al, for example, TMAl (trimethyl aluminum), etc. may be used. As the raw material of N, for example, NH$_3$ (ammonia), MMHy (monomethyl hydrazine), DMHy (dimethyl hydrazine), etc. may be used. As the raw material of Si, SiH$_4$ (monosilane), Si$_2$H$_6$ (disilane), etc. may be used.

According to the embodiments, it is possible to provide a nitride semiconductor device that is formed on a silicon substrate and has an excellent crystal quality with low dislocation density, a nitride semiconductor wafer, and a method for manufacturing a nitride semiconductor layer.

In the specification, "nitride semiconductor" includes all compositions of semiconductors of the chemical formula B$_x$In$_y$Al$_z$Ga$_{1-x-y-z}$N ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nitride semiconductor devices and wafers such as substrates, Al-containing nitride semiconductor layers, foundation layers, semiconductor layers, light emitting parts and functional layers, etc., from known art. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all nitride semiconductor devices, nitride semiconductor wafers and methods for manufacturing a nitride semiconductor layer practicable by an appropriate design modification by one skilled in the art based on the nitride semiconductor device, the nitride semiconductor wafer and the method for manufacturing a nitride semiconductor layer described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device, comprising:
   a foundation layer formed on an Al-containing nitride semiconductor layer formed on a silicon substrate, the foundation layer having a thickness not less than 1 micrometer and including GaN; and a functional layer provided on the foundation layer and directly contacting the foundation layer, the functional layer including a first semiconductor layer, the first semiconductor layer including GaN containing an impurity of Si, the first semiconductor layer having an impurity concentration higher than an impurity concentration in the foundation layer, the Al-containing nitride semiconductor layer including a multilayer structure body, the multilayer structure body including a first layer including an Al-containing nitride semiconductor and a second layer including an Al-containing nitride semiconductor, the second layer being stacked with the first layer, an Al containing ratio of the second layer being smaller than an Al containing ratio of the first layer, and the thickness of the foundation layer being thinner than a thickness of the first semiconductor layer.

2. The device according to claim 1, wherein the thickness of the first semiconductor layer is not less than 1 micrometer.

3. The device according to claim 1, wherein the impurity concentration in the foundation layer is not more than $1 \times 10^{17}$ cm$^{-3}$.

4. The device according to claim 1, wherein the foundation layer is an undoped GaN layer.

5. The device according to claim 1, wherein the first layer is provided in a plurality of first layers, the second layer is provided in a plurality of second layers, and the second layers are alternately stacked with the first layers.

6. The device according to claim 2, wherein the thickness of the first semiconductor layer is not more than 4 micrometers.

7. A nitride semiconductor wafer, comprising:
a silicon substrate;
an Al-containing nitride semiconductor layer provided on the silicon substrate;
a foundation layer provided on the Al-containing nitride semiconductor layer, the foundation layer having a thickness not less than 1 micrometer, and including GaN; and
a functional layer provided on the foundation layer and directly contacting the foundation layer, the functional layer including a first semiconductor layer, the first semiconductor layer including GaN containing an impurity of Si, the first semiconductor layer having an impurity concentration higher than an impurity concentration in the foundation layer, the Al-containing nitride semiconductor layer including a multilayer structure body, the multilayer structure body including a first layer including an Al-containing nitride semiconductor and a second layer including an Al-containing nitride semiconductor, the second layer being stacked with the first layer, an Al containing ratio of the second layer being smaller than an Al containing ratio of the first layer, and the thickness of the foundation layer being thinner than a thickness of the first semiconductor layer.

8. The wafer according to claim 7, wherein
the functional layer further includes:
a light emitting part provided on the first semiconductor layer and including a plurality of barrier layers and a well layer provided between the barrier layers; and
a second semiconductor layer provided on the light emitting part, including a nitride semiconductor, the first semiconductor layer being of a first conductivity type and the second semiconductor layer being of a second conductivity type different from the first conductivity type.

9. The wafer according to claim 7, wherein the thickness of the first semiconductor layer is not less than 1 micrometer.

10. The wafer according to claim 7, wherein the impurity concentration in the foundation layer is not more than $1 \times 10^{17}$ cm$^{-3}$.

11. The wafer according to claim 7, wherein a thickness of the second layer is not less than 5 nanometers and not more than 20 nanometers.

12. The wafer according to claim 7, wherein the first layer is provided in a plurality of first layers, the second layer is provided in a plurality of second layers, and the second layers are alternately stacked with the first layers.

13. The wafer according to claim 11, wherein a crystal growth temperature of the second layer is not less than 600° C. and not more than 1050° C.

14. The wafer according to claim 12, wherein
the functional layer further includes:
a light emitting part provided on the first semiconductor layer and including a plurality of barrier layers and a well layer provided between the barrier layers; and
a second semiconductor layer provided on the light emitting part, including a nitride semiconductor, the first semiconductor layer being of a first conductivity type and the second semiconductor layer being of a second conductivity type different from the first conductivity type.

15. A method for manufacturing a nitride semiconductor layer, comprising:
forming an Al-containing nitride semiconductor layer on a silicon substrate;
forming, on the Al-containing nitride semiconductor layer, a foundation layer having a thickness not less than 1 micrometer and including GaN; and
forming, on the foundation layer and directly contacting the foundation layer, a functional layer including a first semiconductor layer, the first semiconductor layer including GaN containing an impurity of Si, the first semiconductor layer having an impurity concentration higher than an impurity concentration in the foundation layer, the Al-containing nitride semiconductor layer including a multilayer structure body, the multilayer structure body including a first layer including an Al-containing nitride semiconductor and a second layer including an Al-containing nitride semiconductor, the second layer being stacked with the first layer, an Al containing ratio of the second layer being smaller than an Al containing ratio of the first layer, and the thickness of the foundation layer being thinner than a thickness of the first semiconductor layer.

16. The method according to claim 15, wherein the thickness of the first semiconductor layer is not less than 1 micrometer.

17. The method according to claim 15, wherein the impurity concentration in the foundation layer is not more than $1 \times 10^{17}$ cm$^{-3}$.

18. The method according to claim 15, wherein the first layer is provided in a plurality of first layers, the second layer is provided in a plurality of second layers, and the second layers are alternately stacked with the first layers.

* * * * *